United States Patent
Goldberg et al.

(10) Patent No.: US 6,632,344 B1
(45) Date of Patent: Oct. 14, 2003

(54) CONDUCTIVE OXIDE COATING PROCESS

(76) Inventors: Robert L. Goldberg, 56 Wilshire Dr., Sharon, MA (US) 02067; Michael Gulla, 5205 Far Oak Cir., Sarasota, FL (US) 34238

(*) Notice: Subject to any disclaimer, the term of this patent is extended or adjusted under 35 U.S.C. 154(b) by 0 days.

(21) Appl. No.: 09/535,302

(22) Filed: Mar. 24, 2000

(51) Int. Cl.$^7$ .............................. C25D 5/54; C25D 5/48; C25D 5/56; C25D 5/02
(52) U.S. Cl. ....................... 205/159; 205/220; 205/164; 205/125
(58) Field of Search .............................. 205/166, 159, 205/220, 164, 125

(56) References Cited

U.S. PATENT DOCUMENTS

| | | | |
|---|---|---|---|
| 5,419,829 A | * 5/1995 | Fisher et al. ................ | 205/166 |
| 5,484,518 A | 1/1996 | Goldberg et al. | |
| 5,500,106 A | 3/1996 | Goldberg | |
| 5,674,373 A | * 10/1997 | Negrerie et al. ............ | 205/160 |
| 6,325,910 B1 | * 12/2001 | Meyer et al. ................ | 205/159 |

OTHER PUBLICATIONS

IBM Technical Disclosure Bulletin 74C 00934, pp. 3463–3465. Mar. 1974.

* cited by examiner

*Primary Examiner*—Edna Wong
(74) *Attorney, Agent, or Firm*—Robert G. Rosenthal; Robert L. Goldberg

(57) ABSTRACT

The invention is directed to a process for electroplating a non-conducting surface such as through-hole walls within a printed circuit board substrate. The process comprises formation of a conductive oxide coating over a substrate, preferably by immersion of said substrate in an aqueous oxidative desmear solution for a time sufficient to form a coating containing conductive dielectric oxidation residue and then, in the absence of a step of forming an additional conductive coating over the residue coating or removing the coating, electroplating metal onto said surface by immersion of the substrate having the coating in an electroplating solution.

11 Claims, No Drawings

CONDUCTIVE OXIDE COATING PROCESS

BACKGROUND OF THE INVENTION

1. Introduction

This invention relates to new metal plating processes for a variety of uses including fabrication of printed circuit boards. In one embodiment, the invention relates to direct electroplating of copper over a substrate while avoiding the use of an electroleess metal plating solution or the use of an extraneous conductive layer. The process is selective to non-conducting portions of a printed wiring board base material and therefore, copper clad surfaces of a circuit board substrate remain essentially unaffected by the procedure.

2. Description of the Prior Art

For purposes of discussion only, the major portion of the description that follows is directed to the fabrication of printed circuit boards (PCBs) though the process is suitable for formation of any metal coated substrate. Accordingly, the process is useful for decorative plating, formation of mirrors, formation of circuits inclusive of multilayer circuits, double sided circuits and flex circuits.

A conventional process for fabricating a multilayer circuit board starts with a copper clad epoxy innerlayer substrate. A circuit is formed on the innerlayer, multiple innerlayer circuits are stacked, and the stack laminated using heat and pressure. To provide electrical connections between circuit layers, conductive pathways are formed within and through the stack at desired locations. A first step in the process of forming conductive pathways is to drill an array of holes into the stack at desired locations.

Following the drilling of holes, a pretreatment sequence is required prior to metallizing the hole walls. The process involves subjecting the hole walls to a step of smear removal. Smear refers to the drill smear on the walls of holes formed by frictional heating and melting of epoxy during the drilling step. The elimination of smear is practiced in all processes for circuit fabrication to achieve metal adhesion to the hole wall and full electrical continuity between layers of the board through plated holes or vias. Etchback is a term used in connection with smear removal. The term refers to smear removal and is used to remove epoxy to a level deeper than the thickness of the smear, typically to expose about 0.5 mils on the top and bottom surfaces of the innerlayer copper circuitry. Desirably, innerlayer copper protrudes into the drill hole to provide three point connection for copper bonding as required for some military spec boards.

Four methods are used for smear removal and etchback. All use oxidation, neutralization-reduction and glass etching. For many years, sulfuric acid has been used. Major disadvantages include lack of control which leads to hole-wall pullaway and rough holes, and the corrosive nature of sulfuric acid which makes it hazardous to use and difficult to waste treat. Chromic acid provides more control and a longer bath life but problems are encountered with copper voids due to $Cr^{+6}$ poisoning, waste water pollution and contamination of plating processes. Plasma etching is a dry-chemical method to achieve dielectric oxidation. In this process, boards are exposed to oxygen and fluorocarbon gases. Persistent problems with the process are non-uniform treatment of holes and high cost of equipment. Moreover, the process is a batch process and not subject to automation, controls must be provided to prevent air pollution and the cost of the process has limited its use. Permanganate is the current method of choice due to improved copper adhesion to the hole wall resulting in less pullaway, smoother plated through-holes and better control. Permanganate desmear is described by C. A. Deckert, E. C. Couble and W. F. Bonetti, "Improved Post-Desmear Process for the Multilayer Boards", IPC *Technical Review*, January 1985, pp. 12–19 incorporated herein by reference. Moreover, permanganate is non-toxic and easily waste treated.

It is known that permanganate desmear leaves a residue on the hole wall that is a mixture of oxides of manganese, unreacted permanganate and organo manganese compounds. The art has long considered this residue to be undesirable and therefore, has adopted procedures to remove this residue.

A conventional permanganate desmear and etchback process involves the following steps:

| Solvent Pretreatment | 90° F. | 5 minutes |
|---|---|---|
| Alkaline Permanganate | 170° F. | 10 minutes |
| Neutralizer | 120° F. | 5 minutes |
| Glass Etch | RT | 4 minutes |

Solvent pretreatment softens the surfaces of the epoxy. The permanganate solution activates the surface of the epoxy by oxidation and etching. The epoxy substrate is composed of organic micelles. Contact with the alkaline permanganate solution is believed to etch or oxidize micelles from the surface of the epoxy resulting in a roughened porous surface into which a subsequently applied metal deposits. This mechanically bonds the metal deposit to the surface of the epoxy. Contact of the permanganate solution with the hole wall reduces permanganate leaving the above described dielectric oxidation/permanganate residues on the surface of the epoxy. Neutralizer (acid solution) is then used to dissolve the dielectric oxidation residues from the surface of the non-conductor. This is believed to be a critical part of the process as the presence of permanganate residues is thought to interfere with bond strength between the substrate and a subsequently applied metallic coating. Finally, a glass etchant is used to remove glass fibers protruding into the hole due to removal of the epoxy surface during the permanganate etch step.

Metallization is a series of chemical steps following desmear. The process is used to make panel side-to-side and innerlayer connections by plating non-conducting epoxy surfaces with copper. Metallization may be conducted using either electroless techniques or by direct electroplating of copper, a process the industry has termed the direct metallization technique (DMT).

The electroless process includes the above described steps of solvent pretreatment, desmear, treatment with neutralizer, racking the PCB substrates, copper microetching, hole and surface catalyzing with a palladium colloid and electroless copper deposition. A typical sequence following desmear and omitting rinse steps, follows:

Step 1: Cleaner-Conditioner. Alkaline cleaning to remove soil and condition holes.

Step 2: Microetch. Acid etching to remove copper surface contaminants.

Step 3: Sulfuric Acid. Used to remove microetch residues.

Step 4: Pre-dip. Used to maintain chemical balance for the next treatment step.

Step 5: Catalysis. Use of an acid solution of palladium and tin to deposit a thin layer of surface active palladium on the holes walls.

Step 6: Acceleration. Used to remove colloidal tin from the palladium colloid.

Step 7: Electroless Copper. Alkaline chelated copper reducing solution that deposits a thin copper deposit on the surfaces of the holes and other surfaces.

Difficulties are encountered using electroless copper solutions. For example, it is difficult to obtain uniform deposits because the solution composition changes with use. Voids may occur within the holes due to improper hole wall preparation. Plated copper on the hole-walls may pull away and form blisters. Electroless copper solutions may decompose resulting in a rapid plate out of the copper onto the circuit board substrates and onto all surfaces exposed to the copper solution such as tanks and racks. Copper to copper bond failure often occurs if copper cladding is inadequately prepared since electroless copper is deposited onto the copper cladding of the printed circuit board. Waste treatment of electroless copper solutions is costly since the spent solutions contain complexing agents and copper ions, both of which must be removed prior to discharge to the environment. The reducing agent used in electroless copper solutions is conventionally formaldehyde, a suspected carcinogen.

The industry is currently adopting direct metallization techniques (DMT) as an alternative to electroless plating. The basic concept of using a palladium system for direct metallization is disclosed in U.S. Pat. No. 3,099,608 incorporated herein by reference. In this patent, a method using colloidal palladium to metallize through-holes for PCB fabrication is disclosed. Defects in the process of the patent prevented early commercialization. The original concept of using carbon and graphite as a conductive layer dates back to the early days of eyelet boards when graphite was used to convert single-sided PCB's into double-sided boards. Notwithstanding the early direct plate procedures, it was only in the early 1990s that there has been commercial interest in DMT processes for PCB fabrication.

Most current DMT processes fall into three broad categories. They are palladium based systems; carbon and graphite systems; and conductive polymer systems. The first commercially significant palladium based system, known as the EE-1 process, uses a colloidal palladium-tin activator followed by flash electroplating. This process is disclosed in U.S. Pat. No. 4,683,036 incorporated herein by reference. The flash plating bath contains a surfactant to inhibit deposition of copper on foil surfaces without inhibiting deposition on palladium sites. Deposition occurs by propagation from the copper foil and growth epitaxially along the activated surface of a hole during flash plating. The flash plate is then built to full thickness using any electroplating bath.

The DPS system uses a palladium/tin activator with vanillin as an additive in the palladium-tin formulation. This system is disclosed in U.S. Pat. No. 4,933,010 incorporated herein by reference. The system is similar to the EE-1 process but vanillin is said to enhance the rate of epitaxial growth of copper along the catalyzed surface.

The next advance in the use of the palladium/tin activator and the most commercially significant of the palladium-tin activator DMT systems involves conversion of palladium to palladium sulfide as disclosed in U.S. Pat. No. 4,810,333 incorporated herein by reference. This system uses the palladium-tin colloid and an additional step believed to convert adsorbed palladium to palladium sulfide by immersion in an aqueous solution of a sulfide. The sulfide increases conductivity of the coating contributing to lower resistance to electrolytic copper plating. The sulfide form of the palladium colloid has been found to be more chemically resistant to imaging technology.

The second major DMT process uses carbon. One such system is identified as "Black Hole™". The process is disclosed in U.S. Pat. No. 4,724,005 incorporated herein by reference. Black hole uses a carbon suspension to form a conductive coating. Non-conductive surfaces are first conditioned with a polyelectrolyte to facilitate absorption of carbon onto the hole walls. Following formation of the carbon layer, the entire board is heated to fix the carbon to the board. To ensure sufficient conductivity, the carbon treatment is performed twice. Carbon residues must be removed from copper foil surfaces by a microetching step.

Black hole was followed by the use of graphite as disclosed in U.S. Pat. No. 5,389,270 incorporated herein by reference. The process sequence is similar to the carbon sequence. The hole-wall is treated with a polyelectrolyte, graphite is adsorbed onto all surfaces inclusive of hole-walls from a graphite suspension and the coating is then fixed to the surfaces by heating. At least one supplier of such chemicals further uses an ionic solution to enhance conductivity.

A conductive polymer system is disclosed in European Patent No. 0 489 759. This process utilizes conductive polymer to form a conductive layer for direct metallization with electrodeposited copper. After the step of microetching copper foil and solvent pretreatment of hole-walls, an alkaline potassium permanganate conditioning solution is used to form a dielectric oxidation coating containing manganese dioxide and other decomposition residues on the walls of the holes. This manganese dioxide portion of the coating functions as a catalytic oxidizing agent for subsequent processing steps used to form the conductive polymer layer. In the catalyzing step, a solution of a thiophene monomer is used to wet manganese dioxide surfaces. The hole-walls are then treated with a sulfuric acid solution to spontaneously oxidize the thiophene monomer to form a black conductive polymer film on the non-conductive areas of the PCB base material. A similar process disclosed in U.S. Pat. No. 5,183,552 combines the catalyzing and fixation steps in a single step using an acid permanganate treatment solution and pyrrole as the monomer to form a polypyrrole conductive film.

All DMTs described above have common characteristics. Following desmear and etchback, each process requires an additional series of chemical treatment steps to form a layer of material (hereafter the "extraneous layer") possessing adequate conductivity to permit electrolytic copper deposition. The additional sequence of steps required to form the extraneous layer has impact on total process costs, total processing time, equipment size and waste treatment requirements. The impact of this extraneous layer on the overall cost and efficiency can be summarized as follows.

DMTs using palladium colloids require the steps of adsorption of palladium colloid onto a substrate, acceleration to activate the palladium and either a flash plate of copper or treatment with a sulfur compound. Each chemical composition must be controlled during use, accommodated in the number of processing steps by the plating equipment; and each additional chemical composition must be waste treated when spent. The processes are not selective and palladium adsorbs onto copper foil as well as onto the hole walls. Therefore, an aggressive etching step and chemical etching solution are required to remove the palladium from the copper foil prior to electroplating. The etchant must be accommodated by the plating equipment; and spent etchant, containing dissolved copper, must be carefully waste treated before discharge to the environment. Each additional step requires additional rinsing with a concomitant requirement for waste treatment and space within the treatment equipment. It has been found that the process is not suitable for the fabrication of multilayer boards.

Carbon and graphite DMT systems have disadvantages similar to the palladium processes. To electroplate copper onto the surface, it is necessary to form the carbon or graphite extraneous conductive coating over the surface. Once formed, the coating must be fixed by a drying and heating step, steps involving significant energy consumption. Because the process is non-selective, the coating must be removed from copper foil without disruption of the coating on hole walls. It is difficult to selectively remove the carbon or graphite from the foil without causing interconnect defects in a finished board. The carbon or graphite solution is a source of contamination to the entire PCB facility. Spent carbon and graphite solutions must be waste treated, but these solutions are difficult to waste treat because they contain substantial quantities of electrolytes and surfactants to maintain relatively large carbon and graphite particles stable in suspension. Copper etchants and rinse waters used to remove the coating from the copper foil must be carefully waste treated because they contain carbon or graphite in addition to dissolved copper.

Conductive polymer DMT systems possess certain advantages over both carbon and palladium systems because formation of the conductive polymer is selective to non-conducting surfaces whereby polymer does not have to be removed from the copper foil. Though the process is selective, there are problems associated with the use of these materials. The conductive polymer is formed by contact of monomer with dielectric oxidant residues formed during the step of conditioning with permanganate. The polymerization reaction used to form the conductive polymer is a condition sensitive in-situ reaction initiated by contact with oxidant. The reaction is difficult to monitor or control within a hole wall. The polymer film formed by this reaction may be unevenly formed over the non-conducting surfaces. Consequently, there are voids in the polymer film. These voids lead to interconnect defects.

SUMMARY OF THE INVENTION

The subject invention provides a DMT process that eliminates the need for an extraneous conductive layer such as palladium, carbon, graphite, or conductive polymer. Instead, the process uses dielectric oxidation residue formed from conventional or modified desmear oxidizing chemicals as an initial conductive layer, preferably dielectric oxidation residue formed by a permanganate desmear treatment.

The process arises from the observation of several properties of the oxidation residue following desmear. First, it is known that dielectric oxidation residues formed by oxidative desmear remain on the dielectric surface of a part following treatment, but not on metallic surfaces. Using permanganate desmear as an example, the residues contain unreacted permanganate, organo-manganese compounds and manganese dioxide in varied concentrations dependent upon reaction conditions. Second, dielectric oxidation residue left on the surface of a part, such as manganese dioxide, is a weak electrical conductor. In this respect, manganese dioxide has been used as a conductive electrode material in battery fabrication and for other purposes where a conductive coating is required. Third, it is known from the battery literature that enhanced oxidation of metallic oxide conductors by treatment with oxo compounds such as a peroxydisulfate or hydrogen peroxide enhances the conductivity of such coatings. For example, it is known that conductive manganese dioxide coatings are formed by treatment with peroxydisulfate solutions.

Accordingly, the process described herein involves a desmear step with an oxidant to form a dielectric oxidation residue coating on the dielectric surfaces of the part to be plated, optionally, treatment of the dielectric oxidation residue coating with an oxidizing agent, preferably an oxo compound to enhance the conductivity of the coating, and direct electroplating of the dielectric oxidation coating with a desired metal. The total process of the subject invention desirably includes a solvent pretreatment step. The oxo compound selected is desirably a mild etchant for copper. Since desmear materials selectively react with the dielectric of the PCB base material and do not react with copper foil, mild etchants such as the contemplated oxo compounds are satisfactory etchants for the copper. In this way, it is possible that the steps of conductivity enhancement and copper etching may be combined into a single step.

The following chart compares the steps of the subject invention with the DMT processes currently in use.

| Process Step | Inventive Process | Palladium Processes | | | Graphite | Conductive Polymer |
| --- | --- | --- | --- | --- | --- | --- |
| | | Crimson | Neopact | EE-1 | Shadow | Compact CP |
| 1 | Solvent Pretreat | Solvent Pretreat | Solvent Pretreat | Solvent Pretreat | Solvent Pretreat | Solvent Pretreat |
| 2 | Rinse | Rinse | Rinse | Rinse | Rinse | Rinse |
| 3 | Oxidative Desmear | Permanganate Conditioner | Etch Cleaner | Permanganate Conditioner | Permanganate Conditioner | Microetch |
| 4 | Rinse | Rinse | Rinse | Rinse | Rinse | Rinse |
| 5 | Oxidant | Pre-dip | Permanganate Conditioning | Microetch | Graphite Bath | Solvent cleaning |
| 6 | Rinse | Colloidal Palladium | Rinse | Rinse | Heated Drying | Rinse |
| 7 | Electroplate | Rinse | Pre-dip | Pre-dip | Inspect for Defects | Permanganate |
| 8 | | Accelerator | Colloidal Palladium | Colloidal Palladium | Microetch | Rinse |
| 9 | | Rinse | Rinse | Rinse | High Pressure Rinse | Monomer |
| 10 | | Sulfide Solution | Sulfide Solution | Accelerator | Antitarnish | Rinse |
| 11 | | Rinse | Rinse | Rinse | Dry | Soft Etch |

-continued

| Process Step | Inventive Process | Palladium Processes | | | Graphite | Conductive Polymer |
|---|---|---|---|---|---|---|
| | | Crimson | Neopact | EE-1 | Shadow | Compact CP |
| 12 | | Microetch | Dry | Electrolyte Flash | Electroplate | Rinse |
| 13 | | Rinse | Electroplate | Rinse | | Acid Dip |
| 14 | | Dry | | Dry | | Electrolytic Copper |
| 15 | | Electroplate | | Electroplate | | |

The above table illustrates that the process of the invention substantially reduces required chemical materials and processing steps. Since contact with the oxidant is selective to non-conducting surfaces, copper surfaces would not require a severe etch step. This results in a reduction in equipment size and power requirements. Waste treatment requirements are minimized. Extraneous thick intermediate layers between the PCB base material and a copper plate are eliminated avoiding a cause of interconnect defects. The overall process results in a substantially reduced cost to produce a metallized surfaces such as a high resolution circuit board. The circuit board so produced is of superior quality.

DESCRIPTION OF THE PREFERRED EMBODIMENTS

For purposes of illustration, the description that follows is directed to the manufacture of printed circuit boards, but it should be understood that the invention is not limited to this application and is suitable for any application involving the coating of non-conducting surfaces with metal.

The first step in the process preferably comprises treatment of hole walls in a circuit board base material with a solvent, for example, an oxygenated epoxy solvent for epoxy circuit board substrates. Solvents sold for this purpose include acetone, methyl ethyl ketone, methyl cellosolve, butyl carbitol, butyl carbitol acetate, butyl cellosolve and butyl cellosolve acetate. Typically these solutions are used in the form of aqueous alkaline solutions to increase attack on the surface of the epoxy. The solvent is diluted with water to form a 15 to 40% by volume water solution.

Following contact of the PCB base material with the solvent and water rinsing, the substrate is desmeared by contact with an oxidant solution, preferably an acid or alkaline permanganate solution. Chromic acid solutions are also suitable, but lesser preferred. Alkaline permanganate solutions are well known in the art and disclosed and discussed in U.S. Pat. Nos. 4,083,740; 4,425,380; 4,515,829; and 4,601,784; by Deckert et al, Improved Post-Desmar Process for Multilayer Boards, *Printed Circuit World Convention III*, Vol. 13, May 25, 1984; Deckert, Advances in MLB Technology, *Circuit World*, Vol 13, No. 3, 1987; and Deckert, Adhesion Solderability and Productivity: Next Generation PTH, *Printed Circuit Fabrication*, Vol. 11, No. 8, August 1988, each incorporated herein by reference. The permanganate solution is typically one having a pH of from 11 to in excess of 13.5. The combination of a high concentration of permanganate and an elevated temperature provides an increased etch rate on hole wall surfaces. Typical permanganate solution consists of sodium and potassium permanganate in a concentration of between 20 and 50 grams per liter. Sodium permanganate is more soluble and therefore preferred, but more costly than potassium permanganate. Because of cost considerations, potassium permanganate is more commonly used by the industry. The pH of the solution is maintained by addition of a base such as potassium hydroxide.

Alkaline potassium permanganate solutions undergo spontaneous reduction. During use, the rate of reduction is increased when the solution comes into contact with the epoxy resin which is oxidized. The reduction of permanganate can be represented by the following equation.

$$MnO_4^- + 2H_2O + 3e^- \rightarrow MnO_2 + 4OH^-$$

The reaction with epoxy resin is believed to be direct oxidation with the formation of carbon dioxide as shown by the following equation.

$$-CH_2-CH(CH_3)-CH_2-+8KMnO_2 \rightarrow 8MnO_2+4CO_2+8KOH$$

Complete oxidation yields only manganese dioxide. Incomplete oxidation produces a surface that is believe to be a mixture of manganese dioxide, unreacted permanganate and organic residue permanganate byproducts.

The permanganate solution contains the permanganate salt in an amount of from 0.5 grams per liter to saturation and preferably, in an amount of from 10 to 60 grams per liter. The pH of the solution may range from about 1 to in excess of 14 though alkaline permanganate solutions are preferred, and solutions having a pH in excess of 12 are most preferred The desired pH is achieved by use of a hydroxide, preferably an alkali metal hydroxide, in an amount required to adjust pH to the desired value. The amount of hydroxide used may vary between about 1 and 70 grams per liter and more preferably, between about 20 and 50 grams per liter.

Though permanganate desmear solutions find predominant use in the industry, other desmear solutions are used to form dielectric oxidation residue coatings on the surface of a dielectric to be plated. Exemplary additional materials are disclosed in U.S. Pat. No. 5,194,313 incorporated herein by reference. A preferred material disclosed in said patent is a cerium solution such as a cerium sulfate solution. Such as solution would be a mixture of the cerium salt, an acid such as hydrochloric acid, and desirably a surfactant. The acid is added in an amount to provide a pH<1. The cerium salt is used in about the same concentration as permanganate. The dielectric oxidation coating comprises cerium oxide, unreacted cerium salts and organometallic cerium compounds. Additional oxidants solutions that may be used include sources of ferric ion, rubidium, lithium, chromic acid and periodate.

The above oxidants may be used alone or where compatible, in admixture with each other or further in admixture with one or more conductivity enhancers. As used herein, the term "conductivity enhancer" means either a material that increases electrical conductivity of the oxidation residue or the conductive coating formed from the oxidation residue following a step of reduction as discussed below. Cerium salts, as described above, are known conductivity enhancers and fall into the category of materials that increase the conductivity of the oxidation residue. Therefore, one preferred embodiment of the invention comprises a desmear solution that is a mixture of permanganate salt and a cerium salt, the latter used as both an oxidant and a conductivity enhancer. Suitable cerium salts include sulfates and nitrates. A preferred concentration of the cerium salt in the permanganate solution would be from 0.1 percent by weight to saturation, and more preferably, from 1 to 30 percent by weight of solution. Other conductivity enhancers may also be added to the permanganate solution. Examples of materials that increase the conductivity of the coating formed by reduction include easily reducible metal salts such as copper, cobalt and nickel salts that become entrapped in the oxidation residue coating during its formation and are readily reduced to metal during the reduction step described below. Such salts include sulfates, oxides and nitrates and may be added in an amount of from 0.5 to 25 percent by weight of the solution. In solution, they are likely converted to hydroxides, but will still codeposit with the oxidation residue. In addition, a reducible metal ion may be used as the cation of the permanganate salt used to form the permanganate solution. In this respect, alkali and alkaline earth metal permanganates are conventionally used to form permanganate desmear solutions. In accordance with a preferred embodiment of this invention, the permanganate salt used to form the desmear solution is selected from the group of cadmium permanganate, cesium permanganate, silver permanganate for non circuit applications, cobalt permanganate and nickel permanganate. Conductivity enhancers can be used that increase the conductivity of both the oxidation residue and the coating following reduction. Such materials include other conductive oxides such as indium tin oxide, ruthenium tin oxide, tin oxide, zinc oxide, tungsten oxide and zirconium oxide. It should be noted that such materials are not normally conductive, but can be made so by the addition of an impurity and appropriate treatment thereafter. The formation of such materials as conductive particles is disclosed in U.S. Pat. Nos. 4,545,928; 4,457,973; 4,904,526; and 5,742,424, each incorporated herein by reference. These conductive particles, though insoluble in the permanganate solution, may be suspended in solution. They can be added in amounts of from 0.5 to 25 percent by weight of the solution. These materials would be occluded in the oxidation residue to enhance conductivity of the residue and are readily reduced in accordance with procedures to be described below.

Many of the conductivity enhancers discussed above can also be used alone or as a separate treatment solution following formation of the oxidation residue and before the step of reduction. For example, following formation of the oxidation residue, the part could be immersed in a solution of an easily reducible metal salt and then the coating containing adsorbed metal ions could be reduced to a mixture of the manganese and the metal of the metal salt by a step of reduction. Metal salt solutions could be weakly acid to basic solutions of any of the metals described above and can be used in concentrations of from about 0.5 percent by weight to saturation. Alternatively, the conductive metal oxide particles disclosed in the aforementioned patents can be dispersed in a suitable liquid suspending agent, especially an aqueous suspending agent, most preferably water, applied to the surface of the dielectric by immersion of the dielectric into the suspension, and the adsorbed conductive particles reduced to metallic form using the reduction techniques disclosed herein. The particles disclosed in the above referenced U.S. Pat. No. 4,457,973 would be especially suitable for this approach. In this instance, the suspension of the conductive particles may be used with or without the coating of the oxidation residue.

In the most preferred embodiment of the subject invention, conventional permanganate pretreatment chemicals are used modified to enhance conductivity of either the oxide residue coating, the metallic coating following reduction, or both, as described above in combination with a simple oxo treatment step, all as described above.

The above solutions used for the purpose of desmear of hole walls will be referred to herein generically as "desmear solutions", a term well known in the art. As used, the term will refer to the formation of coatings suitable for direct electroplating. Coatings formed using desmear solutions will be referred to as "dielectric oxidation residue coatings".

If desired, a source of fluoride ions may be added to the desmear solution to combine the step of oxidation with a step of dissolution of glass fibers extending into the hole wall. Sodium and potassium fluorides are desirable sources of fluoride ions and may be added to solution in an amount of from 0.1 to 5 percent by weight.

The conditions for treatment of a substrate with the desmear solution are not critical. Typically, the solution is used at a temperature varying from room temperature to slightly below the boiling point of the solution and more preferably, from about 20 to 45° C. Contact time with a substrate may vary from about 1 to 15 minutes and preferably from about 2 to 10 minutes.

In the conventional desmear process, following treatment with the desmear solution, the dielectric oxidation residue coating would be stripped from the surface of the hole walls using a neutralizer solution. This solution generally comprises an acid solution of a reducing agent to dissolve residues from the hole walls. This step is desirably omitted from the process of the subject invention. However, if the oxidation residue is excessive, the neutralizer may be used to remove only the excess from the surface such as the hole wall, but not all of the residue coating. In this respect, to be useful for fabrication of PCBs, the dielectric oxidation coating residue has to be firmly bonded to the surface to be metallized and has to be a continuous coating that fully covers the surface. The desmear reaction with the epoxy resin is an oxidizing reaction that when optimized, will form a thin chemisorbed dielectric oxidation on the surface to be plated that is locked within pores formed by the oxidizing reaction. Excessive attack of the oxidant with the epoxy could form a coating that is excessively thick and frangible. This could cause copper blistering during use of the board. Under such circumstances, it is desirable to strip a portion of the coating from the surface, such as the hole wall, using a neutralizer solution, but its use must be carefully controlled so as not to strip the entire residue from the surface. Sufficient dielectric oxidation residue must be left on the hole wall to function as a conductive layer for metallization. In this respect, the process of the invention is characterized by the absence of a step that would remove the dielectric oxidation coating residue from the surface of the substrate. Conditions required to remove excess residue may be determined by routine experimentation and is governed by the overall thickness of the residue.

The residue formed from treatment with the desmear solution will contain conductive metal oxide and some unreacted oxidant in varying ratios dependent upon the reaction conditions. Using permanganate as an exemplary desmear solution, manganese dioxide residue would be left on the surface oxidized. Manganese dioxide is commonly employed as a cathode material in batteries such as heavy duty, alkaline and lithium cells. The use of manganese dioxide as a conductor is shown in U.S. Pat. Nos. 4,402,931; 4,541,172; 4,549,943; 4,604,336; 4,662,065; 4,863,817; 5,156,934; 5,277,890; 5,346,783; 5,348,726; 5,391,365; 5,401,477; 5,419,986; 5,482,796; 5,489,493; 5,505,200; 5,523,073 and 5,532,084, each incorporated herein by reference.

Battery grade manganese dioxide has been derived from naturally occurring manganese dioxide and synthetically produced manganese dioxide. Synthetic manganese dioxide may be in the form of electrolytic manganese dioxide (ED) and chemical manganese dioxide. In the past, the electrolytic manganese dioxide had been formed by electrolysis of a bath of manganese sulfate and sulfuric acid with ED depositing onto an anode. It was believed that chemical manganese dioxide was unsuitable for electrode use. Wang et al. recently discovered a process for formation of chemical manganese dioxide suitable for use as an electrode material thereby substantially increasing the availability of manganese dioxide for such use and lowering its cost. The Wang et al process is disclosed in the above referenced U.S. Pat. Nos. 5,348,726; 5,391,365; 5,482,796 and 5,532,084. Wang et al discovered that battery grade manganese dioxide is formed by reacting an aqueous solution of manganese sulfate with a peroxodisulfate to form a gamma crystal structure of manganese dioxide as a precipitate. The manganese dioxide precipitate is crystalline and in the form of spherical particles with filament like protrusions emanating from its surface uniformly distributed over the particle surface. It is possible that these protrusions serve as bridges between particles contributing to the conductivity of the coating.

In accordance with the subject invention, treatment of dielectric oxidation coating residue on the surface of a non-conductive surface with an oxo compound such as a peroxodisulfate or hydrogen peroxide following the procedures of Wang et al. is believed to convert manganese oxide residues to a more conductive form increasing the direct electroplating capability of the dielectric oxidation coating. The oxidant is preferably applied as an aqueous solution. A preferred solution comprises from about 1 to 70 grams per liter of an alkali or alkaline earth metal peroxodisulfate solution, preferably a solution of from about 20 to 55 grams per liter. The solution desirably contains an acid such as sulfuric acid to assist in the solubility of the salt in solution. From about 1 to 50 ml of sulfuric acid per liter of solution is desirable. Treatment time may vary from about 0.5 to 10 minutes at temperatures varying between about room temperature and 95° C. This solution is preferred because it is an oxidant for the manganese residues and a mild etchant for copper. In this way, the step of oxidation and copper microetching may be combined into a single step. Alternatively, a 10 to 25 percent hydrogen peroxide solution may also be used.

The next step in the process comprises direct electroplating of metal over the dielectric oxidation residue coating. Two approaches are possible. One involves proceeding directly to the electroplating solution. The other involves an intermediate step of reduction. Each approach has advantages and disadvantages.

Caution must be exercised when using the dielectric oxidation residue coating as the conductive layer for the electroplating step. Certain of these coatings are soluble in acid solution. Therefore, in certain instances, acid copper electroplating baths conventionally used in PCB fabrication processes may not be suitable for the direct plating processes of the invention. Under such circumstances, an alkaline copper electroplating bath may be used. Such baths are known in the art as illustrated in U.S. Pat. Nos. 4,356,067; 4,417,956; 4,462,874; 4,469,569; 4,521,282; and 4,933,051, each incorporated herein by reference. These alkaline plating baths are cyanide free and therefore easier to waste treat and safer to use. Typically, these baths contain a source of cupric ions, a minor amount of zinc ions, a chelating agent such as an organophosponate, a buffering and stabilizing agent such as an alkaline metal carbonate, a grain refining agent, hydroxy ions provide desired pH and a wetting agent. Cupric ions concentration is in the range of from about 3 to 50 grams per liter. The solutions are used at pH varying between about 7.5 and 10.5 though recommended pH varies between about 9.5 and 10. The baths are known to electrodeposit a fine grained, ductile, adherent copper deposit. The bath is typically operated at a temperature of from about 80 to 170° F. though operate best within a temperature range of from 130 to 150° F. They may be operated at cathode current density of from about 0.1 to about 250 amp per square foot with a cathode to anode ratio of from about 1:2 to about 1:6.

Though alkaline copper plating baths are known in the art, they do not possess the plating efficiency of the acid copper plating bath. For this reason, for some applications, it may be desirable to use the alkaline plating bath as a strike bath followed by an acid plating bath to plate to full thickness. The acid plating bath is any of those acid electroplating baths known to the art.

Conditions for electroplating conductive metallic surfaces differ somewhat from the conditions used to plate lower conductivity materials such as the dielectric oxidation residue coating contemplated herein. For this reason, milder plating conditions should be used. The plating bath is operated at temperatures and pH recommended by the bath supplier but current density should be maintained at the low end of the recommended range to avoid burn-off of manganese dioxide, at least during the initial plating stage. Current density may be increased until a maximum level is reached as an initial coating of copper is formed over the manganese dioxide.

As an alternative to the use of an oxide residue as the base for electroplating, the oxide may be reduced to metal and the metal used as the conductive layer for the electroplating step. There are at least two methods available to reduce the oxide to metal, electrolytic reduction and chemical reduction.

Electrolytic processes for reduction of oxides to metal are known in the art. A preferred method is disclosed in IBM Technical Disclosure Bulletin 74C 00934, pages 3463 to 3465, March., 1974; and in unexamined Japanese Patent Application Number 10-240365 filed Aug. 26, 1998, Publication Number 11-165217 published Jun. 22, 1999, each incorporated herein by reference. In general, the process involves connecting the substrate to be plated to the negative terminal of a power source and connecting a second conducing electrode, such as a platinum electrode, to the positive terminal. With the electrodes immersed in an electrolyte, passage of current between the electrodes will reduce the oxide to metal. The electrolyte may be acid, basic or neutral though it is desirable to avoid the use of strongly acid electrolytes as this could dissolve acid soluble oxides. A weak basic electrolyte such as 2 normal potassium hydroxide would be suitable. With a voltage drop of between about 5 and 25 volts across the electrodes, approximately 20 to 40 mA flows through the electrolyte, and within a couple of minutes, the oxide is reduced to metal. The temperature of the electrolyte is not critical but elevated temperatures increases the rate of reduction. The reduced metal is then readily electroplated. In another embodiment of the invention, as will be described in greater detail below, the reduced metal may be used as the current carrying metal itself.

In an alternative lesser preferred embodiment of the invention, chemical reduction may be employed to reduce the oxide to the metal. A strong reducing agent is desired. Preferred reducing agents include amine boranes and borohydrides. Dimethyl amine borane is the preferred reducing agent. Reduction is accomplished by immersion of the part to be plated in a hot alkaline solution of the reducing agent. Temperature is desirably in excess of 150 degrees F. and the pH of the solution is desirably in excess of 9.

In a further embodiment of the invention, reduction may take place by a combination of the methods described above. In this embodiment, electrolytic reduction would be used with an electrolyte containing a reducing agent. A reducing agent compatible with the electrolyte would be added to the electrolyte to assist reduction. The reducing agents described above would be suitable for this embodiment. They would be added to the electrolyte in an amount ranging from about 1 to 50 grams per liter and preferably in an amount of from 5 to 25 grams per liter.

The process described herein substantially reduces the number of processing steps required for plating such as in a conventional PCB manufacturing line because the process line is shorter and the process is selective to those areas where metal deposition is wanted. In particular, the process of the invention is characterized by the elimination of the need to form an additional coating of a conductive material over the manganese dioxide containing coating. A reduction in processing steps translates to a reduced number of proprietary chemicals required for PCB manufacture; smaller, more energy efficient equipment; reduced waste treatment; elimination of aggressive copper etching; and a reduced number of waste water treatment steps. The boards are superior in performance to the boards manufactured by current methods because elimination of a thick extraneous layer of conductive material between the board material and a metal plate would eliminate a cause of interconnect defects.

In the preferred embodiment of the invention, the process for fabrication of a circuit board could be fully additive with no etching of copper cladding required. In this process, the fabricator would start with an unclad PWB board base material. The entire board material would be treated with the permanganate to form the conductive oxide coating. A mask of a circuit pattern would be formed over the surface of the board using a photoresist, preferably a high resolution photoresist. Suitable photoresists are known to the art and exemplary materials are disclosed in U.S. Pat. Nos. 4,839,261; 4,830,953; and 4,820,549; each incorporated herein by reference. For some embodiments of the invention, the photoresist is desirably a material have a high dielectric constant that may be left as a permanent coating on the board. Because the oxide coating is conductive, there is electrical continuity over the full surface of the board. Therefore, openings within the mask may be electroplated to form conductors and metallized hole walls. This is accomplished by either using the electroplating solution directly, preferably the alkaline electroplating solution, or by electrolytically reducing the oxide coating to metal and then electroplating, each as described above. For high resolution boards with narrow spacing between lines, the mask would be removed and the underlying conductive material removed. For extremely high resolution, with very fine lines, the reduction product without build up by electroplating would be suitable to function as the conductor lines. The removal of the mask and underlying coating would not be required for low resolution boards because the spacing between lines would be adequate to prevent shorting through the poorly conductive oxide coating. For example, spacing of at least 5 mils between lines should be sufficient to prevent shorting through the oxide layer. Spaces between circuit lines would then desirably be filled with a permanent dielectric. Such a process would be a dramatic improvement over those processes now in use.

The above process has been described in connection with the formation of a single or double sided circuit board. The process would also be suitable for the formation of multilayer boards including those multilayer boards formed by a sequential build process such as that described in U.S. Pat. No. 5,246,817 incorporated herein by reference. The process is also suitable for the formation of through holes in circuit boards using subtractive techniques.

It should be understood that the process described above can be used to form patterned metal layers for purposes other than the formation of printed circuit boards. For example, alternative uses could comprise formation of nameplates, color filters, liquid crystal displays, transistsors, etc. In addition, it should be understood that the above procedure for forming patterned metal on a surface can be accomplished using poorly conductive materials other than the manganese oxide residues.

The invention will be better understood by reference to the following examples.

EXAMPLE 1

This example illustrates plating of a double-sided through hole circuit board substrate using permanganate residues as a conductive coating.

A drilled copper clad epoxy/glass multilayer printed circuit board panel was immersed in an alkaline permanganate solution having the following composition:

| | |
|---|---|
| Potassium Permanganate | 65 grams per liter |
| Sodium Hydroxide | to pH 13 |
| Water | to 1 liter |

The copper clad panel was immersed in the permanganate solution for 10 minutes at 180° F. and cold water rinsed. The panel so prepared had a dark visible coating on exposed plastic surfaces. The panel was then immersed in an aqueous solution containing 100 grams per liter of potassium persulfate at room temperature for 5 minutes and water rinsed. The panel so prepared was then directly electroplated by immersion in an alkaline copper electroplating solution identified as E-Brite 30 from Electrochemical Products, Inc. without dilution and the part was electroplated at 20 amps per square foot at 75° F. Following removal of the panel from the solution, it was examined and found to have a dark brown copper deposited continuously over all surface including hole wall plastic surfaces.

EXAMPLE 2

The procedure of Example 1 may be repeated by inclusion of a step of pretreatment in an oxygenated solvent for epoxy such as MLB Conditioner 211 available from Shipley Company, L.L.C. for 3 minutes at 70° C. followed by water rinsing. The solvent pretreatment would precede the step of immersion in the permanganate solution with similar results obtained though the copper would be more firmly adhered to the surface of the circuit board panel.

EXAMPLE 3

The procedure of Example 1 could be repeated by treatment with an aqueous solution comprising 60 grams per liter of sodium peroxodisulfate and 40 milliliters per liter of sulfuric acid for 5 minutes subsequent to treatment with the permanganate solution and prior to the step of electroplating with copper.

EXAMPLE 4

The procedure of Example 1 could be repeated using an acid copper electroplating solution subsequent to treatment with the alkaline copper plating solution. A suitable electroplating bath would be Bebson E-339 Bright Acid Copper available from McGean Rohco Inc.

EXAMPLE 5

The procedure of Example 1 may be repeated with 5 grams per liter of cerium sulfate added to the permanganate solution.

EXAMPLE 6

The procedure of Example 1 may be repeated replacing the permanganate solution with the following solution.

| Cerium (IV) Sulfate | 50 grams per liter |
| Sulfuric Acid | to pH 1 |
| Water | to 1 liter |

EXAMPLE 7

The procedure of Example 2 may be repeated by inclusion of a step of electrolytic reduction. A clip would be attached to the circuit board base material and the board would be immersed in an electrolyte containing 5 grams of ammonium hydroxide per liter. The lead from the clip would be connected to the negative terminal of a power source. A platinum electrode would be connected to the positive terminal. Current flow would be adjusted to 30 mA. Current would be passed through the cell for 5 minutes to reduce the oxide to metal. Thereafter, the part could be electroplated.

What is claimed is:

1. A process for electroplating a non-conducting substrate, said process comprising the steps of (1) forming a coating comprising manganese oxide over at least a portion of said substrate by immersing the non-conducting substrate in an aqueous permanganate desmear solution for a time sufficient to form said coating over at least portions of said substrate, (2) reducing said manganese oxide coating over said substrate to a metal, and (3) electroplating metal onto said coating by immersion of the substrate into an electroplating solution while passing a current from an electrode, through said solution to said substrate.

2. The process of claim 1 characterized by the absence of a step that would remove the manganese oxide coating.

3. The process of claim 1 where the step of reduction is electrolytic reduction.

4. The process of claim 3 where the electrolyte contains a chemical reducing agent.

5. The process of claim 1 where the step of reduction is chemical reduction.

6. The process of claim 5 where the reducing agent is a compound of boron.

7. The process of claim 1 where the substrate is a printed circuit board base material.

8. The process of claim 7 where the printed circuit board base material contains through holes.

9. The process of claim 8 where the circuit board base material is unclad circuit board base material.

10. The process of claim 1 including the step of coating the manganese oxide coating with a patterned mask before the step of metal plating.

11. The process of claim 1 characterized by the absence of a step of treatment with a neutralizer solution.

* * * * *